(12) United States Patent
Sharma et al.

(10) Patent No.: US 10,964,701 B2
(45) Date of Patent: Mar. 30, 2021

(54) VERTICAL SHARED GATE THIN-FILM TRANSISTOR-BASED CHARGE STORAGE MEMORY

(71) Applicant: Intel Corporation, Santa Clara, CA (US)

(72) Inventors: Abhishek Anil Sharma, Hillsboro, OR (US); Van H. Le, Portland, OR (US); Gilbert William Dewey, Beaverton, OR (US); Rafael Rios, Austin, TX (US); Jack T. Kavalieros, Portland, OR (US); Yih Wang, Portland, OR (US); Shriram Shivaraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/480,948

(22) PCT Filed: Mar. 31, 2017

(86) PCT No.: PCT/US2017/025391
§ 371 (c)(1),
(2) Date: Jul. 25, 2019

(87) PCT Pub. No.: WO2018/182689
PCT Pub. Date: Oct. 4, 2018

(65) Prior Publication Data
US 2019/0393223 A1    Dec. 26, 2019

(51) Int. Cl.
*H01L 27/108* (2006.01)
*G11C 11/401* (2006.01)
(Continued)

(52) U.S. Cl.
CPC ...... *H01L 27/10808* (2013.01); *G11C 11/401* (2013.01); *G11C 11/404* (2013.01);
(Continued)

(58) Field of Classification Search
CPC ... G11C 11/401; G11C 11/404; H01L 27/108; H01L 27/10841; H01L 27/10864
(Continued)

(56) References Cited

U.S. PATENT DOCUMENTS 5,561,308 A * 10/1996 Kamata ............. H01L 27/10841
257/301
5,907,170 A *  5/1999 Forbes .............. H01L 27/10864
257/296

(Continued)

OTHER PUBLICATIONS

International Preliminary Report on Patentability for International Patent Application No. PCT/US2017/025391, dated Oct. 10, 2019, 12 pages.

(Continued)

*Primary Examiner* — Son L Mai
(74) *Attorney, Agent, or Firm* — Schwabe, Williamson & Wyatt P.C.

(57) ABSTRACT

A charge storage memory is described based on a vertical shared gate thin-film transistor. In one example, a memory cell structure includes a capacitor to store a charge, the state of the charge representing a stored value, and an access transistor having a drain coupled to a bit line to read the capacitor state, a vertical gate coupled to a word line to write the capacitor state, and a drain coupled to the capacitor to charge the capacitor from the drain through the gate, wherein the gate extends from the word line through metal layers of an integrated circuit.

15 Claims, 5 Drawing Sheets

(51) Int. Cl.
*G11C 11/404* (2006.01)
*G11C 11/408* (2006.01)
*G11C 11/4096* (2006.01)
*H01L 21/02* (2006.01)
*H01L 21/311* (2006.01)
*H01L 21/768* (2006.01)
*H01L 27/13* (2006.01)
*H01L 49/02* (2006.01)
*H01L 29/22* (2006.01)
*H01L 29/24* (2006.01)
*H01L 29/40* (2006.01)
*H01L 29/423* (2006.01)
*H01L 29/66* (2006.01)
*H01L 29/786* (2006.01)
*H01L 21/3105* (2006.01)

(52) U.S. Cl.
CPC ...... *G11C 11/4085* (2013.01); *G11C 11/4096* (2013.01); *H01L 21/02554* (2013.01); *H01L 21/02565* (2013.01); *H01L 21/31111* (2013.01); *H01L 21/76802* (2013.01); *H01L 27/10855* (2013.01); *H01L 27/10873* (2013.01); *H01L 27/10897* (2013.01); *H01L 27/13* (2013.01); *H01L 28/60* (2013.01); *H01L 29/22* (2013.01); *H01L 29/24* (2013.01); *H01L 29/401* (2013.01); *H01L 29/42392* (2013.01); *H01L 29/66969* (2013.01); *H01L 29/78642* (2013.01); *H01L 21/31053* (2013.01)

(58) Field of Classification Search
USPC .......................................................... 365/149
See application file for complete search history.

(56) References Cited

U.S. PATENT DOCUMENTS

| | | | |
|---|---|---|---|
| 6,337,497 | B1 | 1/2002 | Hanafi et al. |
| 6,727,539 | B2* | 4/2004 | Divakaruni ....... H01L 27/10891 257/288 |
| 7,372,093 | B2* | 5/2008 | Sommer .......... H01L 27/10841 257/301 |
| 8,294,189 | B2* | 10/2012 | Chou ................ H01L 29/66181 257/301 |
| 8,330,211 | B2* | 12/2012 | Sung ................... H01L 29/7827 257/328 |
| 2002/0006699 | A1 | 1/2002 | Noble et al. |
| 2004/0245569 | A1 | 12/2004 | Kowalski et al. |
| 2007/0018223 | A1 | 1/2007 | Abbott |
| 2008/0068876 | A1 | 3/2008 | Sandhu et al. |

OTHER PUBLICATIONS

International Search Report and Written Opinion for International Patent Application No. PCT/US2017/025391 dated Dec. 27, 2017, 16 pgs.

* cited by examiner

VERTICAL SHARED GATE THIN-FILM TRANSISTOR-BASED CHARGE STORAGE MEMORY

CROSS-REFERENCE TO RELATED APPLICATION

This patent application is a U.S. National Phase Application under 35 U.S.C. § 371 of International Application No. PCT/US2017/025391, filed Mar. 31, 2017, entitled "VERTICAL SHARED GATE THIN-FILM TRANSISTOR-BASED CHARGE STORAGE MEMORY," which designates the United States of America, the entire disclosure of which is hereby incorporated by reference in its entirety and for all purposes.

FIELD

The present description is related to memory cells for semiconductors and, in particular, to capacitive memory cells with a vertical access transistor.

BACKGROUND

In silicon semiconductor processors, memory is critical for performing many functions. SRAM (Static Random Access Memory), DRAM (Dynamic Random Access Memory) and flash are the most common types of solid state memory in use currently. SRAM is typically built as a 6T (six transistor) circuit which is very fast and compatible with CMOS (Complementary Metal Oxide Semiconductor) logic, but expensive due to the large number of transistors. It also requires frequent refresh cycles to avoid losing its stored state. This increases power consumption and heat generation. Flash memory is comparatively slow and therefore difficult to use as large scale high speed locally accessed memory.

2T (two transistor) or 3T memory gain cells are normally used for DRAM (Dynamic Random Access Memory). DRAM is not as fast as 6T SRAM but is less expensive and requires less frequent refresh cycles. A common type of DRAM cell stores the memory state in a capacitor. To reduce refresh cycles, a large capacitor with a high charge capacitance is used. In standard planar silicon technology, the large capacitor is formed in a deep trench in the Si substrate. The deep trench is not compatible with processes for standard CMOS logic circuitry and requires a significant lateral Si area. DRAM cost and density is therefore optimized when fabricated on a separate die from the logic circuitry.

With a separate die, the DRAM can be made using the best or lowest cost techniques available for DRAM without regard to the logic circuitry. Nevertheless, the separate die and external connection increases the cost of the overall system. In addition, even with special fabrication techniques, DRAM still has high off-state leakages that limit the retention times of the corresponding memory cell. Constant refresh cycles are required to retain the state stored in the memory. The refresh cycles require power so that DRAM also requires constant power and generates significant heat.

Most DRAM is built as a 1 transistor, 1 capacitor cell (1T1C) in which the transistor is used for accessing the correct bit-cell through its gate. The capacitor is used to store charge, which is the bit-cell information. When the access transistor is a typical Si transistor, the capacitor charge leaks through the access transistor and also through the substrate. When too much of the charge has leaked, then the bit cell value is lost. Frequent refresh cycles recharge the capacitor to prevent this data loss. However, the refreshes interfere with memory access, consume power, and generate heat. As flash memory becomes faster and smaller, some systems avoid DRAM entirely and use only SRAM (Static Random Access Memory) and flash memory.

However, flash memory is still much slower than DRAM especially for write operations.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

Thin film transistors (TFT) are one of the most attractive options to fuel Moore's law by integrating ultra-low-leakage transistors in the back-end, so that the transistors are vertically above the silicon. This leaves the Si area for high-speed transistors. Many TFTs are lateral, in that the transistors are horizontally placed, and suffer from a problem of low mobility. The low mobility limits the drive current and therefore the performance of a resulting circuit.

A DRAM 1T1C vertical wrap-around back-end transistor structure is described here in some embodiments. The resulting memory cell structure that uses a low-leakage back-end transistor is able to hold a capacitor charge much longer. Using shared access lines, e.g. wordlines, WLs) and shared data lines (for read and write, known as bit-lines, BLs), the memory circuit is compact, low-power, and fast.

In embodiments described herein a low-leakage access (WL) transistor renders a memory cell to be virtually non-volatile. The structure allows room for highly-scalable and dense storage cells for large memory arrays. Density of an array is improved with vertical access lines and shared crisscrossed horizontal data lines. The resulting array has extremely low-power operation.

The structure shows many valuable characteristics. Sharing BLs and WLs in a compact fashion provides for an extremely compact lateral footprint. A vertical transistor may be configured for high current without consuming much lateral space. The vertical WL transistor provides sufficient current for high-speed memory access and write. The TFT leakage is extremely low, making the memory cell almost non-volatile, as opposed to DRAM which needs a constant power-hungry refresh.

Figure 1:
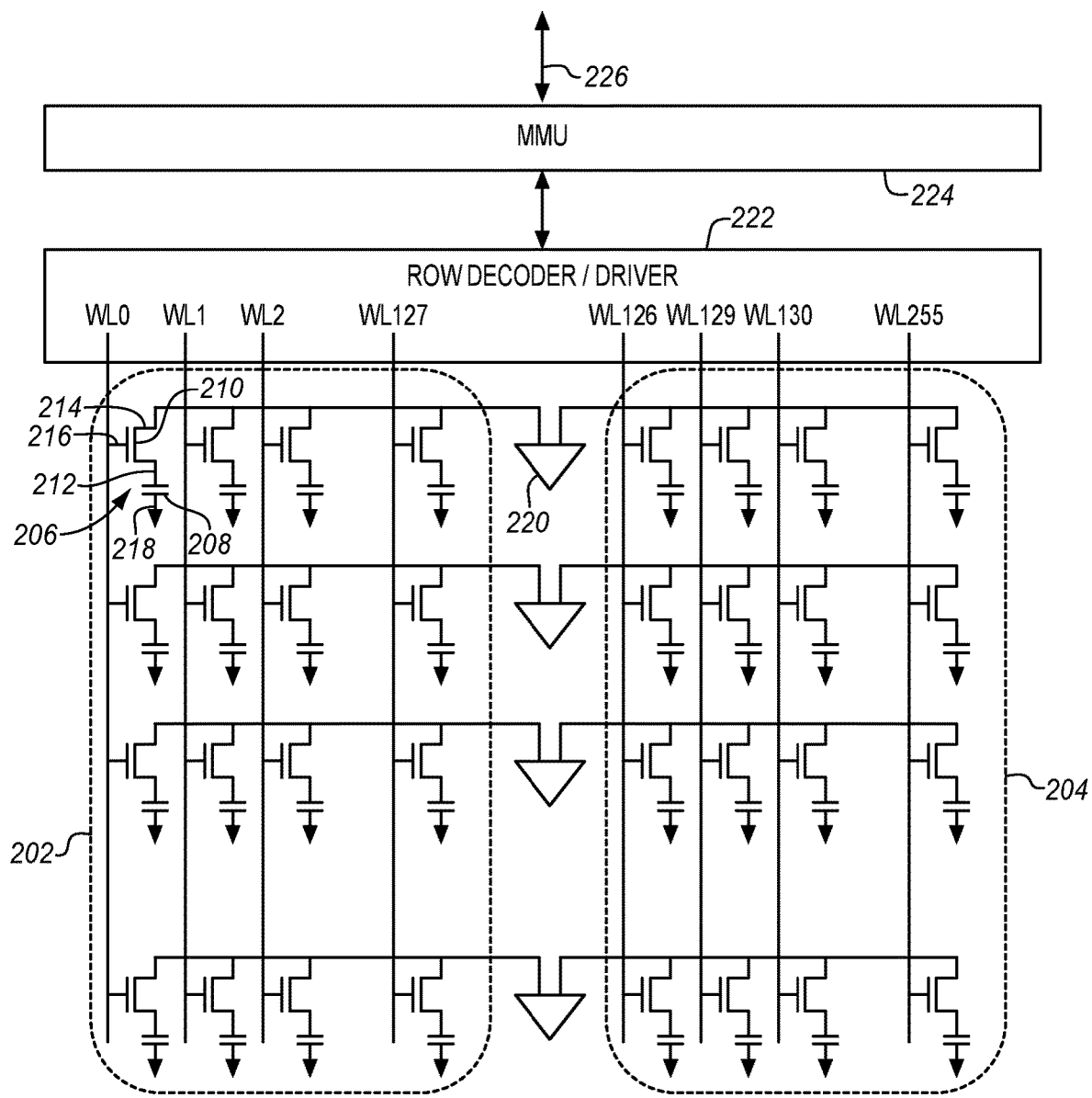
FIG. 1 is a block diagram of a DRAM array using 1T1C cells with column and row access suitable for use with embodiments.

FIG. 1 is a diagram of a DRAM memory array using 1T1C memory cells. The array has a left side sub-array 202 and a right side sub-array 204. Each sub-array has 1T1C memory cells 206 arranged in rows and columns. A memory cell has a capacitor 208 to store charge. The capacitor is coupled between a drain node 212 of a transistor 210 and a ground 218. The transistor has a source 214 coupled to a sense amp. The sense amp provides the charge to store in the capacitor and senses the state of the capacitor on a read. The transistor 210 has a gate 216 coupled to a word line (WL0) to provide for sensing and writing cycles. If there is a self-refresh cycle, this is also enabled by the word line. As shown, the sense amp is coupled to each memory cell in a column and the word line is coupled to each memory cell in a row. A particular memory cell is accessed by selecting a respective sense amp column and word line row.

The word lines are connected to and controlled by a row decoder and driver 222 that controls the operation of the word lines and sense amplifiers. A memory management unit (MMU) 224 controls the row decoder and driver and maps bit values into memory cells for storage and later retrieval. The MMU may also drive self-refresh rates, diagnostic functions, power control, startup and other functions. The MMU may be coupled to many more arrays than the one shown. The MMU is coupled through a bus 226 to a memory controller for access by processing resources. The processing resources may be on the same or a different die or printed circuit board.

The particular memory cell, sub-array, array, and control configuration of FIG. 1 is provided as an example. Embodiments of the present invention may be applied to other types of sub-arrays, arrays, and control configurations.

Figure 2:
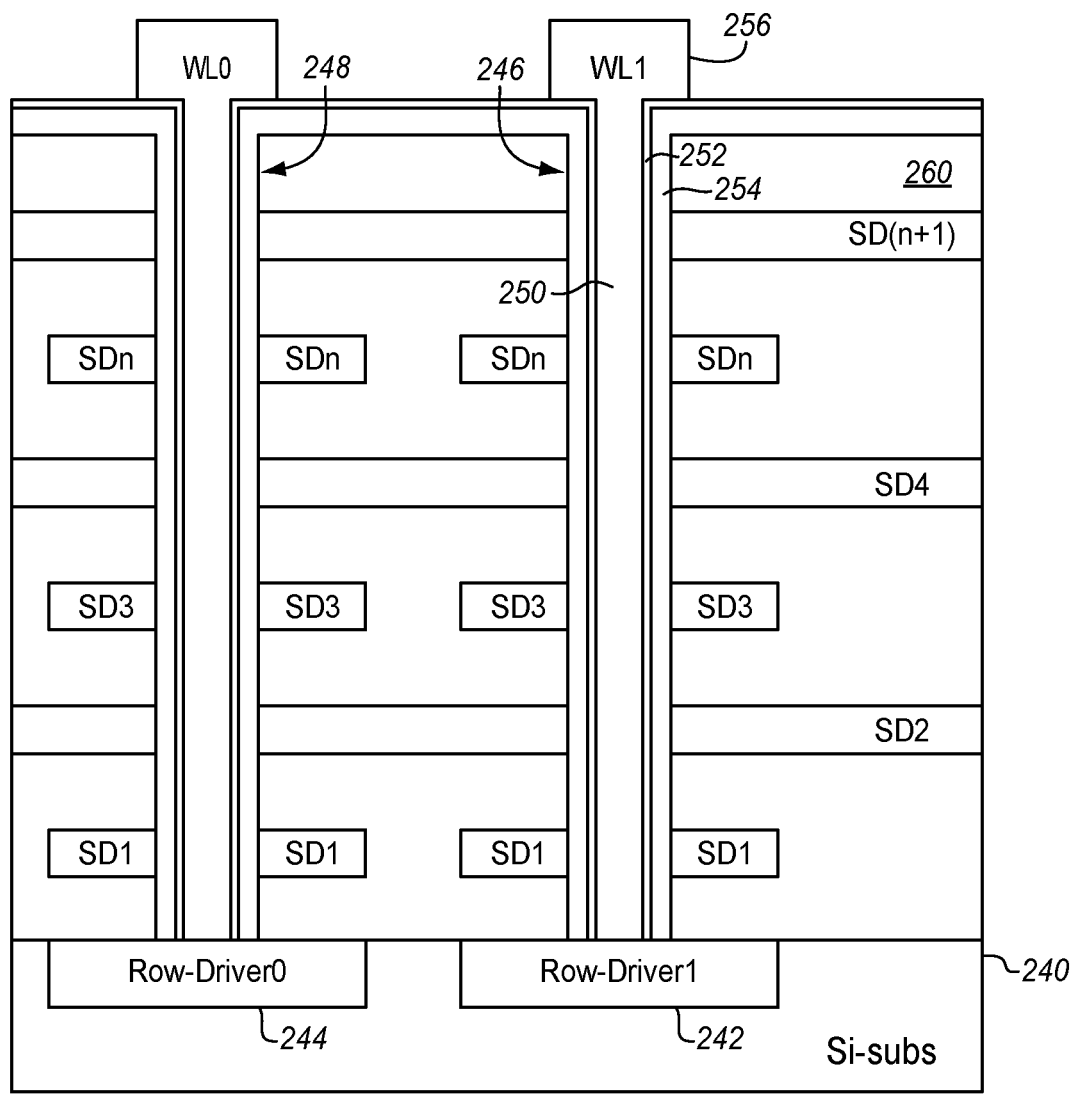
FIG. 2 is a diagram of a vertical thin film transistor (TFT) suitable for use as the access transistor of a 1T1C memory cell according to an embodiment.

FIG. 2 is a diagram of a vertical thin film transistor (TFT) suitable for use as the access transistor 210 of a 1T1C memory cell 206 such as that of FIG. 1 or for use in another system. The vertical TFT may be formed in ILD (Inter-Layer Dielectric) and metal layers above a silicon substrate. As shown, a silicon substrate 240 forms a base for the TFT structures. Active circuitry of any desired type may be formed on the silicon substrate using planar or fin technology. Vias, redistribution, metal routing and any other suitable layers may also be formed in the substrate. These circuits may include power supplies, memory controllers, memory management units, row decoder and drivers, and logic and processing circuitry. These components are not shown in order not to obscure the invention. For the two vertical TFTs 246, 248 there is a respective row driver 242, 244. These row drivers are coupled to appropriate active circuitry of the silicon substrate or another location.

Each vertical TFT 246, 248 has a vertical inner gate 250 that connects to the row driver in the silicon substrate or on a metal layer. The vertical gate is formed of a metal, polysilicon or other suitable material and serves as a common connection node through a series of source/drain layers labeled as SD1, SD2, SD3, SD4, SDn, SD(n+1). In other words, the gate is shared by all of the sources and drains in the vertical stack of access transistors. Each source/drain layer provides a source on one side and a drain on the other side for each respective access transistor of a row. In this way a series of TFTs are built one over the other vertically through the ILD and metal layers.

The central gate material 250 is surrounded by a vertical gate dielectric layer 252. The gate dielectric layer is surrounded by a semi-oxide 254 or other material between the gate and each source/drain layer. The outer layers 252, 254 are annular and wrap around the gate. This increases the effective width of the gate oxide to reduce leakage and improve current performance. As mentioned above the sources are connected to sense amps and the drains are coupled to capacitors (not shown). The capacitors may be formed in the dielectric layers above the substrate or in the substrate, depending on the particular implementation.

The vertical shared gate allows for a wordline to be formed by a stack of transistors connected through the single shared gate. An array of memory cells may have an array of stacked channels that extends in two directions (across the page and into the page as shown in the diagram).

Figure 3:
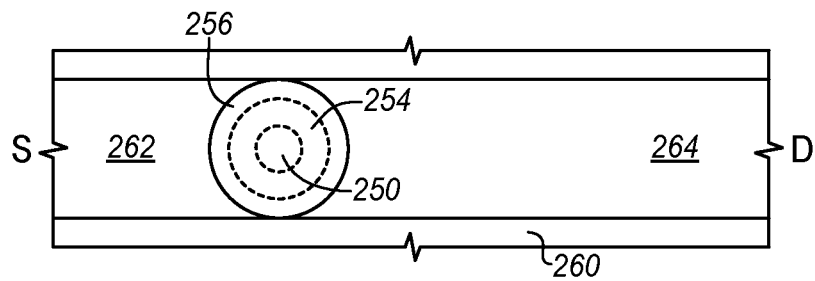
FIG. 3 is a top view of a vertical shared gate of FIG. 2 according to an embodiment.

FIG. 3 is a top view diagram of one of the vertical shared gates 246 of FIG. 2. As shown, each vertical gate has a conductive central core 250, an annular charge trapping dielectric 252, and an oxide outer annulus 256. The two annular structures wrap around the central core to form the channel of the stack of transistors. The outer annulus is surrounded by the dielectric of the stacked structure. The source 262 and drain 264 metal layers are shown as connecting to the vertical gate and channel, although these would not be visible in a top view.

The illustrated vertical shared gate TFT may be formed using materials and processes already in use with other BEOL (Back End of the Line) processes. The sizes of each of the structures and layers may be adjusted to suit different size, speed, current flow, impedance, capacitance and other requirements. The single shared gate allows for a high on current ($I_{ON}$) this allows the capacitor loads to be charged or discharged faster. Memory access time is related to the applied voltage and inversely related to $I_{ON}$ ($C_{load}V_{dd}/I_{ON}$). The high $I_{ON}$ significantly reduces access time. Moving the storage capacitor to be separate from the access transistor also reduces access time. As a result the load to be driven is small while the $I_{ON}$ is still boosted.

The gate material 250 is formed of any of a variety of conductive materials suitable for gate materials, including metals and polysilicon. The gate dielectric 252 may be formed of $HfO_2$, $TiO_2$, $Ta_2O_5$, $SiO_2$, SiN and the like, deposited using atomic layer deposition, chemical vapor deposition, physical vapor deposition, sputtering etc. Alternatively, conventional gate dielectric materials may be used.

The outer semi-oxide layer 254 provides a semi-conductive barrier between the gate dielectric and the source and drain (SD) layers. The semi-oxide layer may be an amorphous semiconductor, a polycrystalline semiconductor, a chalcogenide, a semi-conductive oxide, or the like, or combinations thereof. In some examples, the semi-oxide layer may include $SnO_2$, SnO, CoO, IGZO, ZnO, CuO, $Cu_2O$, ITO, IZO, NiO, InO, GaO, or the like, or combinations thereof. In some examples, the semi-oxide layer may be doped with one or more metals. Other thin film transistor materials may alternatively be used for any of the wrap around layers in the vertical shared gate transistor.

Figure 4:
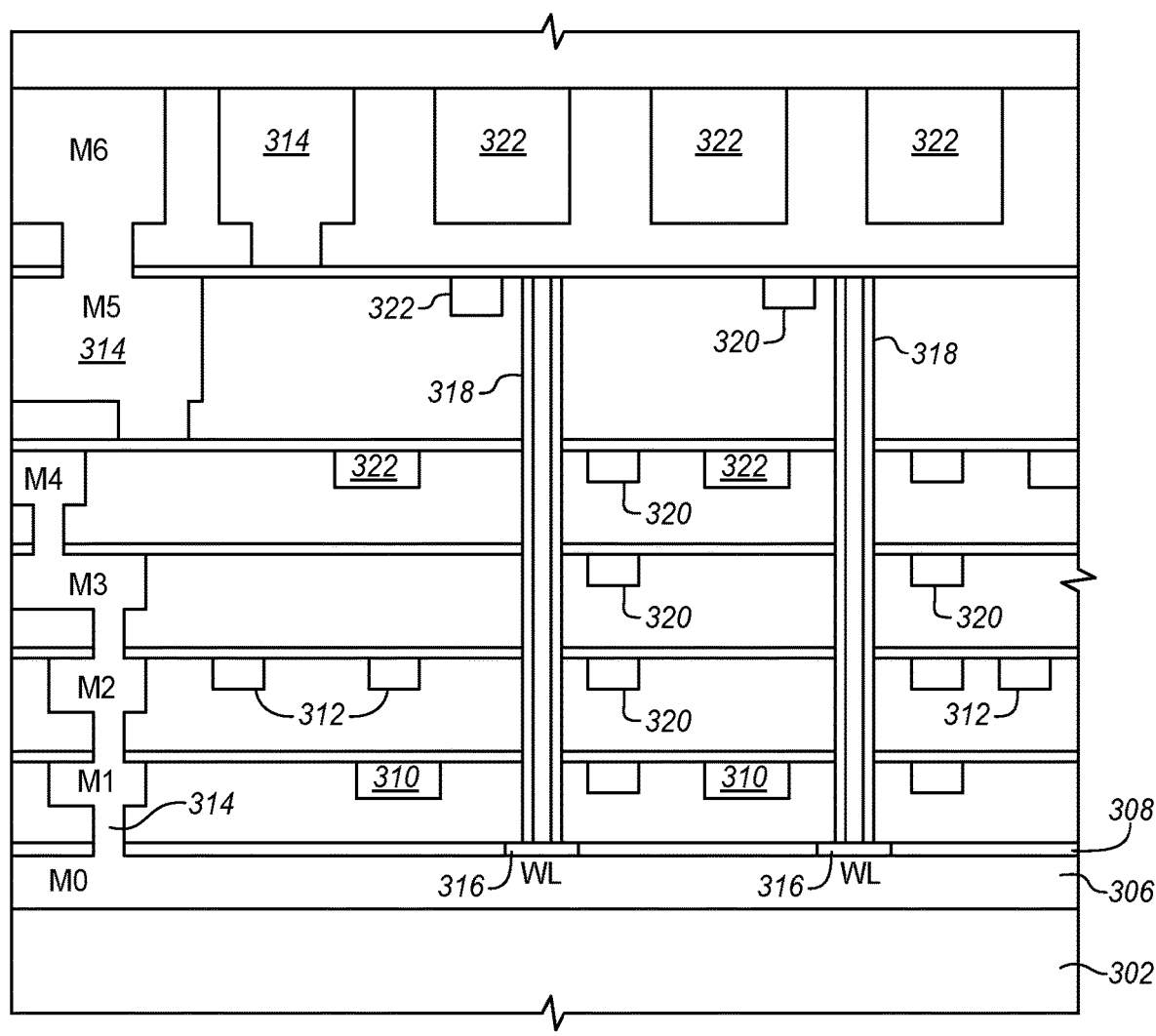
FIG. 4 is a cross-sectional side view diagram of a portion of a memory cell array in metal and Inter-Layer Dielectric (ILD) layers above a silicon substrate according to an embodiment.

FIG. 4 is a cross-sectional side view diagram of a portion of a memory cell array in metal and ILD layers above a silicon substrate. The base of the structure is a silicon substrate or any other suitable type of substrate 302. Active circuitry is formed in layers over the silicon substrate. As mentioned, the active circuitry is optional and may include any desired circuits for the memory cells or for other functions, such as processing, communications, etc. A series of metal layers and intervening dielectric are formed over the active circuitry. The seven illustrated layers are identified as M0 to M6, however, there may be more or fewer layers to suit different purposes. Each layer has a layer of metal 306 such as aluminum or copper and a dielectric layer 308 over the metal such as $SiO_2$, porous $SiO_2$ doped with carbon, SiCOH, SiN and other low-k dielectrics.

The metal layers may be used to provide a variety of different connections. Some of the layers may be pattered to form discrete signal lines 310, 312, 322 with separate paths. These signal lines may be to support the memory array or for other purposes. There may also be metal or conductive pillars 314 to connect lines of one metal layer with lines of another metal layer or with other structures through the dielectric.

The vertical transistors 318 shown in FIG. 2 extend from M0 to M5, however they may extend through more or fewer metal layers. At M0, the transistors are coupled to a word line 316 which is connected to the active circuitry on the substrate. The wordlines are coupled to row drivers which may be on the silicon substrate or in another location. The vertical transistors have a vertical shared gate at their core with a gate dielectric and oxide. The metal layers provide the source and drain connections for the vertical gate.

The drain side of these source and drain connections each connect to a capacitor 320 within the metal layers. The capacitors are formed on or near the metal layers and store a charge to represent the stored data value. The capacitors are also connected to ground opposite the drain connection through other signal lines (not shown). As shown, the single transistor acts as a gate for multiple capacitors which provide multiple storage cells.

The resulting storage cells are virtually non-volatile, due to the low-leakage of the vertical shared gate access transistor. By stacking multiple capacitors, the memory structure is highly-scalable and dense. The low leakage allows for extremely low-power operation and extremely low heat.

Figure 5:
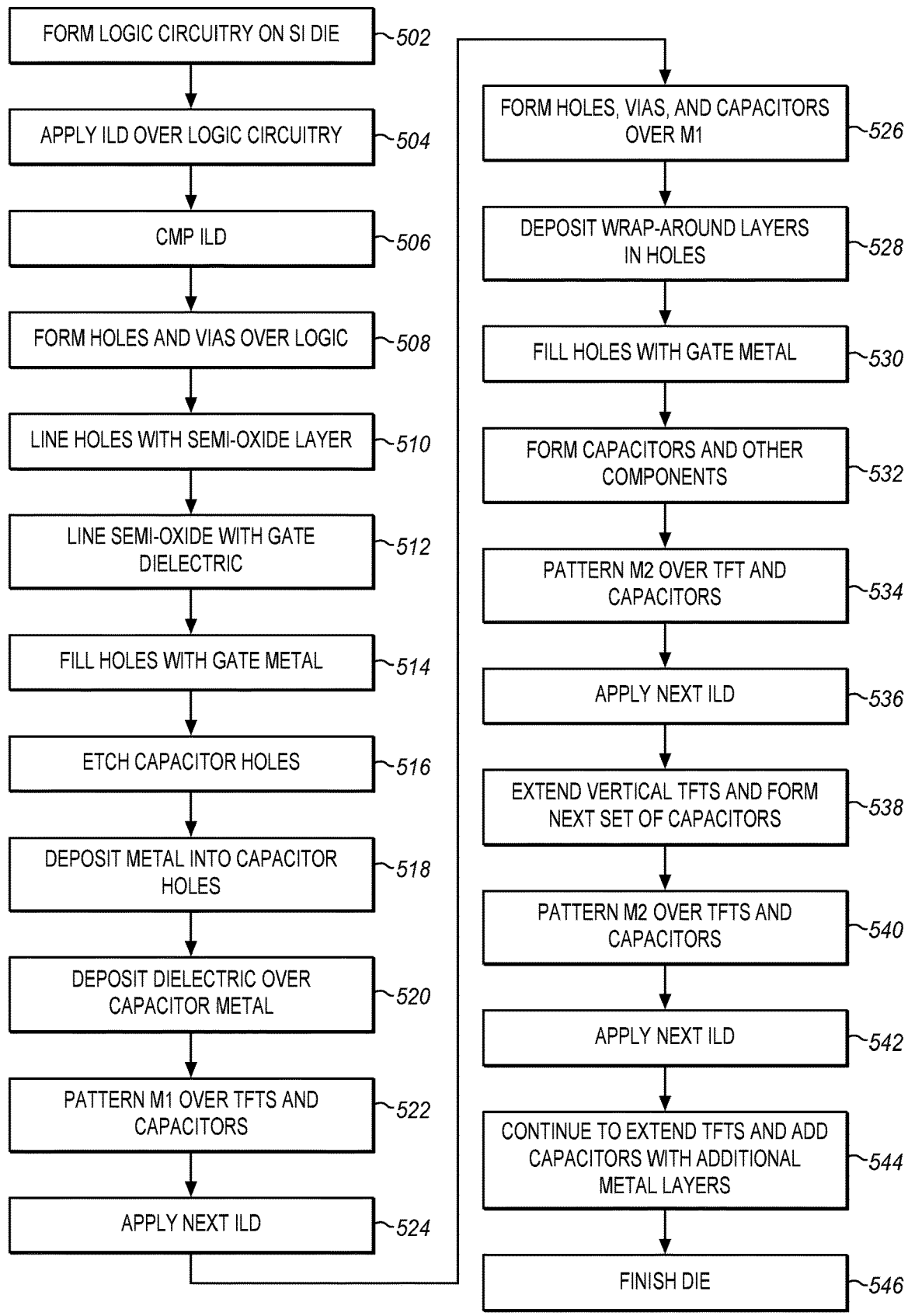
FIG. 5 is a process flow diagram of forming a 1T1C memory cell array according to an embodiment.

FIG. 5 is a process flow diagram of forming a 1T-1C memory cell array with vertical shared gate wrap around transistors in BEOL (Back End of the Line) layers as shown in FIG. 4. At 502 the logic circuitry is formed on the silicon die, this includes the control and voltage supply circuitry for each memory cell of the array as well as the read, write, refresh and other circuitry. The circuitry may include electrodes for the word lines and other components to connect to the vertical transistors and other components. The logic circuitry layer also includes the wordline WL, sensing amplifiers, row and column select for the memory cell and the necessary circuitry to activate and drive these lines.

At 504 an interlayer dielectric is applied over the logic circuitry. There may also be other layers applied over the logic circuitry depending on the particular implementation. This may be formed of a standard ILD material or any other suitable dielectric.

At 506 a CMP (chemical metal planarization) is applied over the dielectric layer. At 508 vias or holes are formed over the logic circuitry to provide a vertical channel for the gate of the TFTs. Additional vias may be formed by etching an opening into the planarized ILD and then filling the opening with copper or another suitable conductor.

For the vertical transistors, the holes are first lined with the appropriate thickness of semi-oxide at 510. The semi-oxide may also be applied over the top of the dielectric layer as shown in FIG. 2. The semi-oxide is then lined with a layer of gate dielectric at 512, which may also be applied over the top and the hole is then filled with the gate metal at 514. This completes a first part of the vertical TFT. The gate metal may be patterned to form electrodes or other structures, depending on the particular implementation. The layers may be deposited using, atomic layer deposition, chemical vapor deposition, physical vapor deposition, evaporation, sputtering etc., depending on the aspect ratio of the hole.

At the same time that vias and holes are etched, openings may be etched at 516 to form the capacitors. The capacitor, as shown in FIG. 4 is formed in the ILD. A first plate is then formed in the opening at 518 by depositing a metal layer into the opening. A dielectric is formed over the deposited metal at 520. The other plate of the capacitor and the contact electrode may then be the next metal layer. Due to the common processes and materials, the capacitor and other components may be made at the same time that the vertical transistors are being made. This allows the memory array to be fabricated in fewer operations.

A second metal layer is then patterned and applied at 522 over the TFTs, the vias, the capacitors and the rest of the dielectric to form signal lines, capacitor plates, and the source and drain areas of the access transistor. This layer is shown as M1 in FIG. 4. As mentioned above, there may be other metal and dielectric layers formed over the logic circuitry before this layer. At 524, the next layer of dielectric is applied over the first back end metal layer. The metal may first be planarized and protected with a nitride etch stop layer before the next layer of ILD is applied.

At 526, the dielectric is etched to open areas for a vertical extension of the TFTs and to construct more capacitors. Provision may also be made for other components and signal lines. In this operation, the ILD and nitride etch stop layer are removed to expose the metal lines corresponding to the sources and drains and any other connections.

The hole is formed directly over the existing vertical gate to extend the gate through another metal and ILD layer. This allows the gate to be shared through many vertical layers. After the holes are formed then another set of wrap around layers are applied to the access transistor holes and the holes at 528. The holes are filled at 530 and any additional capacitors or other components are formed at 532.

At 534 a metal layer is patterned over the ILD. As mentioned, this metal layer may include source, drain and other connections as well as signal lines for other components and circuits. CMP may be used again to planarize the metal layers including the TFT gate. A nitride etch stop deposition is performed over the gate metal and then another ILD layer is deposited at 536 to reach the level of the next metal layer. The ILD is planarized and then another layer of the vertical gates and of capacitors may be formed at 538. At 540 another metal layer is patterned over the next level of TFT and capacitors. At 542 the next ILD is applied.

At 544 the process of extending the TFTs and building new capacitors, connected through patterned metal layers continues until the memory array is completed. This may use six metal layers as shown in FIG. 4 or more or fewer metal layers may be used.

These operations may be performed simultaneously for thousands or millions of memory cells in the same layers at the same time to produce a memory array that is very close to the logic circuitry and which does not add to the area of the die, only the height. If the array is formed in metal layers that are otherwise required, then the height also is not increased.

At 546 after the metal and ILD layers have been formed with the embedded memory array and any other components, then the die is finished with routing layers, contact pads, solder balls and any other desired components. Additional operations may also be applied to the back side of the die, such as thinning, applying heat spreaders and other operations.

Figure 6:
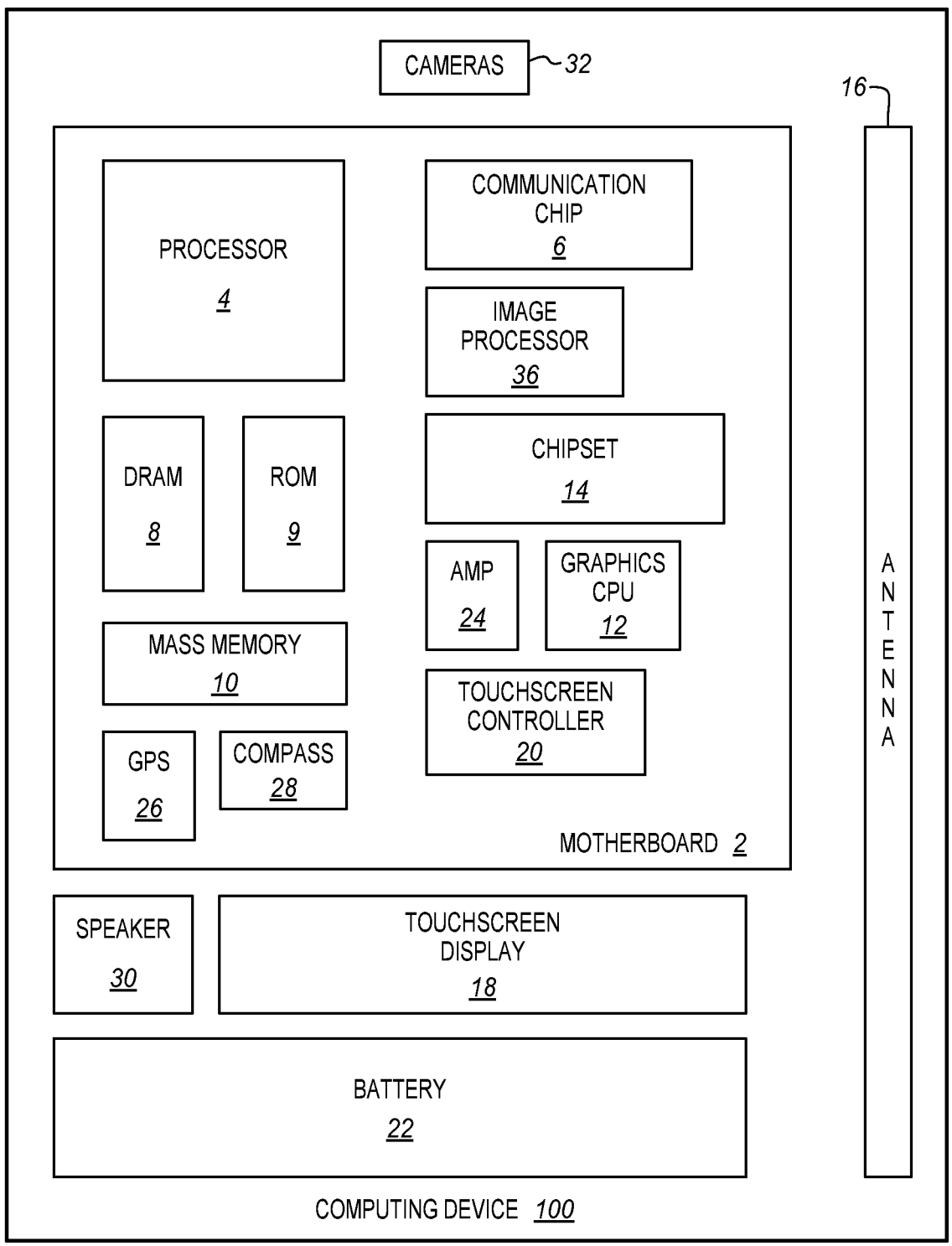
FIG. 6 is a block diagram of a computing device incorporating a die with a memory cell array according to an embodiment.

FIG. 6 illustrates a computing device 100 in accordance with one implementation. The computing device 100 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

In some implementations, the integrated circuit die of the processor, memory devices, communication devices, or other components are fabricated to include one transistor, one capacitor memory cells with a DRAM or other element as described herein. The described memory cells may be embedded as memory for other components in a CMOS or other logic processing die or a standalone memory array may be made on its own die. The term "processor" may refer to any device or portion of a device that processes electronic data from registers and/or memory to transform that electronic data into other electronic data that may be stored in registers and/or memory.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 100 may be any other electronic device that processes data including a wearable device.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a memory cell structure that includes a capacitor to store a charge, the state of the charge representing a stored value, and an access transistor having a drain coupled to a bit line to read the capacitor state, a vertical gate coupled to a word line to write the capacitor state, and a drain coupled to the capacitor to charge the capacitor from the drain through the gate, wherein the gate extends from the word line through metal layers of an integrated circuit.

In some embodiments the gate extends through an inter-layer dielectric between the metal layers.

In some embodiments the access transistor comprises a gate dielectric wrapped around a metal gate and a semi-oxide layer wrapped around the gate dielectric.

In some embodiments the gate extends through an inter-layer dielectric and wherein the semi-oxide layer is between the gate dielectric and the inter-layer dielectric.

In some embodiments the drain is formed in the metal layers to connect to the capacitor through one of the metal layers.

In some embodiments the metal layers are over circuitry formed on a silicon substrate, the circuitry including a wordline driver and a wordline driver electrode and wherein the gate extends through the metal layers to a wordline electrode on the silicon substrate.

In some embodiments the metal layers are back end layers vertically above a silicon substrate.

In some embodiments the access transistor extends through a first metal layer, wherein the drain is formed in the first metal layer, and wherein the capacitor is formed adjacent to the first metal layer and coupled to the access transistor through the first metal layer.

In some embodiments the capacitor is formed in an inter-layer dielectric adjacent to the first metal layer.

In some embodiments the access transistor is a vertical thin film transistor.

In some embodiments the access transistor extends through back end metal layers over an integrated circuit and wherein the capacitor is also in the back end over the integrated circuit.

Some embodiments pertain to a method that includes forming a metal layer over a die, forming an dielectric layer over the metal, forming holes and vias in the dielectric, lining the holes with a semi-oxide layer, lining the semi-oxide with a gate dielectric, filling the holes with a gate metal, etching capacitor holes, depositing metal into the capacitor holes, depositing dielectric over the metal in the capacitor holes, and patterning metal over the capacitor hole dielectric and the gate metal to connect the gate metal as an access transistor gate to the capacitor hole dielectric as a charge device to form a one transistor, one capacitor charge storage memory.

Further embodiments include applying a second dielectric layer over the patterned metal, forming and filling holes and capacitor holes to form a second access transistor over the first access transistor and a second capacitor, and patterning a second metal layer over the second access transistor and second capacitor to form a second one transistor, one capacitor charge storage memory wherein the gate of the second access transistor is vertically aligned and electrically connected to the first access transistor.

Further embodiments include forming active circuitry on the die before forming the metal layer, the active circuitry comprising row driver to access the capacitor charge through the access transistor.

In some embodiments patterning metal comprises patterning the metal to form a source and a drain for the access transistor.

In some embodiments lining the holes with a semi-oxide layer comprises depositing a metal-doped semiconductor layer onto the dielectric layer.

Some embodiments pertain to a computing system that includes a mass memory having instructions stored thereon, and a processor coupled to the memory to execute the instructions, the processor having silicon logic circuitry formed on a silicon substrate and a memory array having a plurality of memory cells, the memory array being formed in back end metal layers formed over the logic circuitry, the gain cells each having a capacitor to store a charge, the state of the charge representing a stored value, and an access transistor with a vertical thin film transistor structure having a drain coupled to a bit line to read the capacitor state, a vertical gate coupled to a word line to write the capacitor state, and a drain coupled to the capacitor to charge the capacitor from the drain through the gate.

In some embodiments the thin film transistor extends through back-end metal layers over an integrated circuit.

In some embodiments the capacitor is also in the back end over the integrated circuit.

In some embodiments the thin film transistor is a vertical wrap-around back-end transistor.

The invention claimed is:

1. A memory cell structure comprising:
   a capacitor to store a charge, the state of the charge representing a stored value; and
   an access transistor having a source coupled to a bit line to read the capacitor state, a vertical gate coupled to a word line to write the capacitor state, and a drain coupled to the capacitor to charge the capacitor from the drain through the gate, wherein the gate extends from the word line through metal layers of an integrated circuit.

2. The structure of claim 1, wherein the gate extends through an inter-layer dielectric between the metal layers.

3. The structure of claim 1, wherein the access transistor comprises a gate dielectric wrapped around a metal gate and a semi-oxide layer wrapped around the gate dielectric.

4. The structure of claim 3, wherein the gate extends through an inter-layer dielectric and wherein the semi-oxide layer is between the gate dielectric and the inter-layer dielectric.

5. The structure of claim 1, wherein the drain is formed in the metal layers to connect to the capacitor through one of the metal layers.

6. The structure of claim 1, wherein the metal layers are over circuitry formed on a silicon substrate, the circuitry including a wordline driver and a wordline driver electrode and wherein the gate extends through the metal layers to a wordline electrode on the silicon substrate.

7. The structure of claim 1, wherein the metal layers are back end layers vertically above a silicon substrate.

8. The structure of claim 1, wherein the access transistor extends through a first metal layer, wherein the drain is formed in the first metal layer, and wherein the capacitor is formed adjacent to the first metal layer and coupled to the access transistor through the first metal layer.

9. The structure of claim 8, wherein the capacitor is formed in an inter-layer dielectric adjacent to the first metal layer.

10. The structure of claim 1, wherein the access transistor is a vertical thin film transistor.

11. The structure of claim 10, wherein the access transistor extends through back end metal layers over an integrated circuit and wherein the capacitor is also in the back end over the integrated circuit.

12. A computing system comprising:
    a mass memory having instructions stored thereon; and
    a processor coupled to the memory to execute the instructions, the processor having silicon logic circuitry formed on a silicon substrate and a memory array having a plurality of memory cells, the memory array being formed in back end metal layers formed over the logic circuitry, the memory cells each having a capacitor to store a charge, the state of the charge representing a stored value, and an access transistor with a vertical thin film transistor structure having a source coupled to a bit line to read the capacitor state, a vertical gate coupled to a word line to write the capacitor state, and a drain coupled to the capacitor to charge the capacitor from the drain through the gate.

13. The system of claim 12, wherein the thin film transistor extends through back-end metal layers over an integrated circuit.

14. The system of claim 13, wherein the capacitor is also in the back end over the integrated circuit.

15. The system of claim 12, wherein the thin film transistor is a vertical wrap-around back-end transistor.

* * * * *